United States Patent
Lee

(10) Patent No.: US 6,581,182 B1
(45) Date of Patent: Jun. 17, 2003

(54) ITERATIVE DECODING WITH POST-PROCESSING OF DETECTED ENCODED DATA

(75) Inventor: Inkyu Lee, Kearny, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/570,764

(22) Filed: May 15, 2000

(51) Int. Cl.[7] .................. H03M 13/03; H04L 23/02; H03D 1/00
(52) U.S. Cl. .................. 714/795; 714/780; 375/262; 375/341
(58) Field of Search ................... 714/780, 784, 714/786, 791, 792, 794, 795, 796, 756, 752, 746; 375/262, 241; 341/143

(56) References Cited

U.S. PATENT DOCUMENTS

| | | | | |
|---|---|---|---|---|
| 6,023,783 A | * | 2/2000 | Divsalar et al. | 714/792 |
| 6,292,922 B1 | * | 9/2001 | Ruscitto et al. | 714/795 |
| 6,452,985 B1 | * | 9/2002 | Hatakeyama et al. | 375/341 |
| 6,487,694 B1 | * | 11/2002 | Bajwa | 714/786 |

OTHER PUBLICATIONS

"Iterative Decoding Of Binary Block and Convolutional Codes" by Joachim Hagenauer, *Fellow, IEEE*, Elke Offer, and Lutz Papke, *IEEE Transactions on Information Theory*, vol. 42, No. 2, Mar. 1996, pp. 429–445.

"A Viterbi Algorithm With Soft–Decision Outputs and its Application" by Joachim Hagenauer and Peter Hoeher, *IEEE*, German Aerospace Research Establishment, 1989, pps. 1680–1686.

\* cited by examiner

*Primary Examiner*—Christine T. Tu
(74) *Attorney, Agent, or Firm*—Steve Mendelsohn; Ian M. Hughes

(57) ABSTRACT

An iterative decoder employs detection and post-processing of channel output samples to generate soft output vales for encoded data provided to the decoder for one or more iterations of decoding. The channel output samples account for user data encoded with concatenated codes. For one or more other iterations, the reliability values of the soft values of the prior iteration are updated, generating soft output data for the decoder for the current iteration of decoding. A detector may use a soft-output Viterbi algorithm (SOVA) to detect encoded data from channel output samples, and the SOVA algorithm may be implemented by a Viterbi algorithm generating hard decisions from the output channel samples followed by post-processing to generate and update reliability values for the soft-output values based on the hard decisions and output channel samples. In one implementation, generating soft-output values from output channel samples by a detector employs the full soft-output Viterbi algorithm (SOVA) during the first iteration. For subsequent iterations, the post-processor of the full SOVA algorithm is used without a Viterbi detector.

15 Claims, 2 Drawing Sheets

ITERATIVE DECODING WITH POST-PROCESSING OF DETECTED ENCODED DATA

BACKGROUND OF THE INVENTION

1. Field of the Invention

The present invention relates to communication systems that encode and decode with concatenated codes, and, more particularly, to iterative decoding of data detected from a communication medium.

2. Description of the Related Art

Concatenated code systems for encoding and decoding data use two or more component codes that are concatenated during the process of encoding the data. Although the component codes may be of any type, the component codes are typically relatively simple codes such as the convolutional codes. The two or more component codes are concatenated either in serial or in parallel. For example, in serial concatenation of two component codes, data is first encoded by a first encoding module with a first component code. This encoded data is, in turn, passed through an interleaver and then applied to a second encoding module for encoding with a second component code. This process operates on only a single, serial data stream, and the first and second component codes may be the same code. In the parallel concatenation, in one processing path data is encoded with the first component code and in the other processing path data is interleaved and then is encoded with a second component code. The two encoded streams are combined in parallel by, for example, interleaving to provide a single encoded data stream.

For either serial or parallel concatenation, the encoded data is then used to modulate a signal that is passed through a communication (transmission) channel to a receiver, which processes the transmitted signal from the transmission channel. Such transmission channel may correspond to recording on and playback from a magnetic medium, or may correspond to transmission between users through a cellular/wireless/wired channel. The transmission channel has a corresponding frequency response that possibly includes memory (e.g., a partial response channel). The signal modulated by the encoded data has an added noise component and added signal distortion caused by the channel's frequency response as the signal passes through the transmission channel.

The term "output channel sample" refers to the samples of the channel output (signal modulated by encoded data) from the transmission channel that is generated through the sampling process of the receiver. The receiver typically includes a detector to detect the sequence of symbol bits representing the encoded data from the output channel samples. A decoder receives the detected symbol sequence from the detector and decodes the sequence of symbol bits o reconstruct the data. The decoder may be a simple decoder reversing the encoding process, or it may be an iterative decoder that repetitively decodes the data for a predefined number of iterations or until a predetermined decoding metric, such as maintaining the bit-error rate (BER), is less than a specified threshold.

The detector and the decoder may each typically employ a partial-response, maximum-likelihood (PRML) algorithm (e.g., a Viterbi algorithm (VA)), a maximum a posteriori (MAP) algorithm, or a soft-output Viterbi algorithm (SOVA). SOVA algorithms are known in the art and is described in, for example, J. Hagenauer and P. Hoeher, "A Viterbi Algorithm With Soft Decision Outputs and Its Applications," *Proc. of IEEE Globecom '89*, pp. 1680–1686, November, 1989, the teachings of which are incorporated herein by reference.

Concatenated code systems may employ iterative decoding of encoded data using either serial or parallel iterative decoding methods. When employing iterative decoding of data encoded with a concatenated code, a block of data is input to the iterative decoder. The block boundaries desirably conform to symbol boundaries of the concatenated code. The iterative decoder may comprise N component code decoders for decoding in accordance with each of the N component codes originally used to encode the data. The particular implementation of the iterative decoder is dependent on whether the encoding process was based on serial or parallel concatenation.

In an iterative decoding method, the complete decoding process during each iteration subjects a block of encoded data to decoding by each of the N component code decoders. The complete decoding process repeats for each iteration until a predetermined number (I) of decoding iterations are complete. Each iteration performs a complete, "soft" decoding of the data encoded with a concatenated code (i.e., a decoding with each component code of the concatenated code). Each iteration allows for higher confidence in the decisions for bits in the decoded data that are made based on the soft-output values provided from the detector.

The following definitions may be of use to understanding the encoding and decoding methods. A set of binary values U is defined in the Galois field-2 (GF(2)) with elements $\{+1, -1\}$ where $-1$ is the "null" element under $\oplus$ addition. The reliability value $L(u)$ is the log-likelihood ratio of the binary random values in U and is defined as the natural log of the ratio of the probability that the random variable U takes on the value $u=+1$ to the probability that the random variable U takes on the value $u=-1$. The sign of $L(u)$ is used as a hard decision by a detector, and the magnitude of $L(u)$ is used as a reliability statistic for the hard decision.

In an iterative decoding scheme, the reliability values for decoded user bits are updated at each iteration, utilizing the information extracted from the previous iteration, termed "soft-in, soft-out" decoding. Iterative decoding of concatenated codes using "soft-in, soft-out" information is well known in the art and is described in, for example, J. Hagenauer, E. Offer, and L. Papke, "Iterative Decoding of Block and Convolutional Codes", *IEEE Transactions on Information Theory*, Vol. 42, No. 2, March 1996, whose teachings are incorporated herein by reference.

To decode a block of output channel samples to provide a block of decoded data, the soft-in, soft-out decoder receives the output channel sample values from a transmission channel as well as a priori reliability values $L'(u)$ for the information bits u. The a priori reliability values $L'(u)$ may be 0 for the first iteration, and, after the first iteration, the soft decision (a posteriori) reliability values $L(u)$ for the information bits from the previous iteration. Also provided are "extrinsic" values $L_e(u)$ for the decoded information bits. The "extrinsic" values $L_e(u)$ may be values based on indirect information not available from a previous iteration (e.g., other parity bits added to the information bits or the values from decoding with one component code that are subsequently used to make a hard decision for an information bit when decoding with another component code. For each decoding iteration in the 2-dimensional case, the decoder completes a decoding operation for each component code. In this case, the extrinsic values $L_e(u)$ may be employed sequentially as a priori reliability values L'(u) for soft-in, soft-out decoding of each component code.

When concatenated codes are used to encode data that is then passed through a transmission channel with memory, additional decoding (performance) gain is achieved when each iteration of decoding also includes full demodulation of the received data. Full demodulation refers to complete detection of a block of symbols from the output channel samples before subjecting the block of symbols to an iteration of decoding. This is commonly termed a "full-iteration" decoding scheme because, in effect, iterative detection also takes place in the receiver. The full iterative decoder may be implemented as a serial iterative decoder that operates sequentially with I iterations. While MAP detectors achieve optimum performance, they are complex to implement, adding considerably to the complexity of iterative decoders. Consequently, for each iteration, detectors of the prior art typically employ a soft output Viterbi algorithm (SOVA) detector generating soft-output values for detected symbols from the output channel samples since the SOVA algorithm is less complex to implement in, for example, an integrated circuit (IC). The particular form of the SOVA algorithm used by the detector is based on the impulse response of the transmission channel.

An implementation of serial full-iteration decoding of the prior art is shown in FIG. 1 and applies I iterations of the decoding process on each block of output channel samples. A new block of output channel samples is applied to SOVA detector 101(1), which generates soft-output values. The soft-output values are then provided to decoder 102(1), which decodes the soft-output values to complete a first iteration of decoding. For the second iteration of decoding, the output of decoder 102(1) and the original output channel samples are provided to SOVA detector 101(2), which generates a new set of soft-output values. Since the decoding process itself may correct errors from incorrectly detected symbols, the output of the decoder may be used to evaluate the decisions for detected symbols, which may be reflected in updated reliability values of the detected sequence. The new set of soft-output values are provided to decoder 102(2), which decodes the new set of soft-output values to complete the second decoding iteration.

A fully decoded block is provided as data from the Ith decoding module 102(I), corresponding to the Ith decoding iteration. For a circuit implementation, a single SOVA detector and a single decoder may be employed using feedback from the output of the decoder back to the input of the SOVA detector. The iterative decoder then completes I iterations through an initial detection and decoding step followed by (I−1) steps of detection and decoding with soft-output decoded data from the feedback path.

SUMMARY OF THE INVENTION

The present invention relates to iterative decoding in which reliability values for detected data are updated with each iteration of decoding. For a first iteration, detected values for detected data may be generated by a soft-output Viterbi algorithm (SOVA) using a Viterbi detector and a post-processor. The reliability values are then used to decode during the first iteration. For each subsequent iteration, the post-processor is used to update the reliability values without the Viterbi detector before decoding. Employing a post-processor rather than implementing a full SOVA algorithm for each subsequent iteration may provide for, for example, reduced circuit area and complexity in an iterative decoder.

In accordance with an embodiment of the present invention, in a signal processing application, an iterative decoder decodes user data encoded with a concatenated code. The iterative decoder comprises a soft-output detector; and at least one post-processor and decoder pair. In a first-iteration, the soft-output detector generates, from output channel samples, soft-output values corresponding to decisions for the encoded user data; the post-processor of a first pair updates a set of reliability values corresponding to the decisions for the encoded user data based on the decisions and the output channel samples; and the decoder of the first pair decodes the set of soft-output values to provide decisions for decoded user data. In a subsequent iteration, the post-processor of a pair updates the set of reliability values to form a new set of soft-output values; and the decoder of the pair decodes the new set of soft-output values to provide new decisions for the decoded user data.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
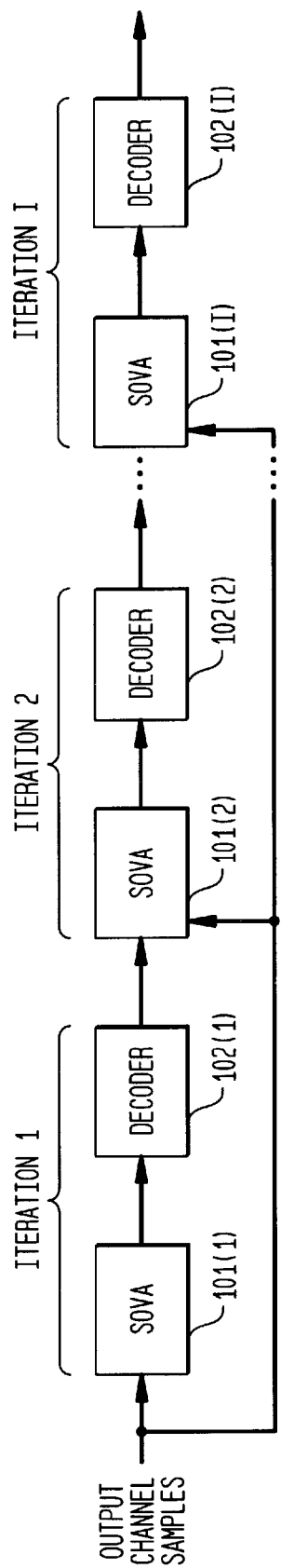
FIG. 1 shows an implementation of serial, full-iteration decoding of the prior art.
Figure 2:
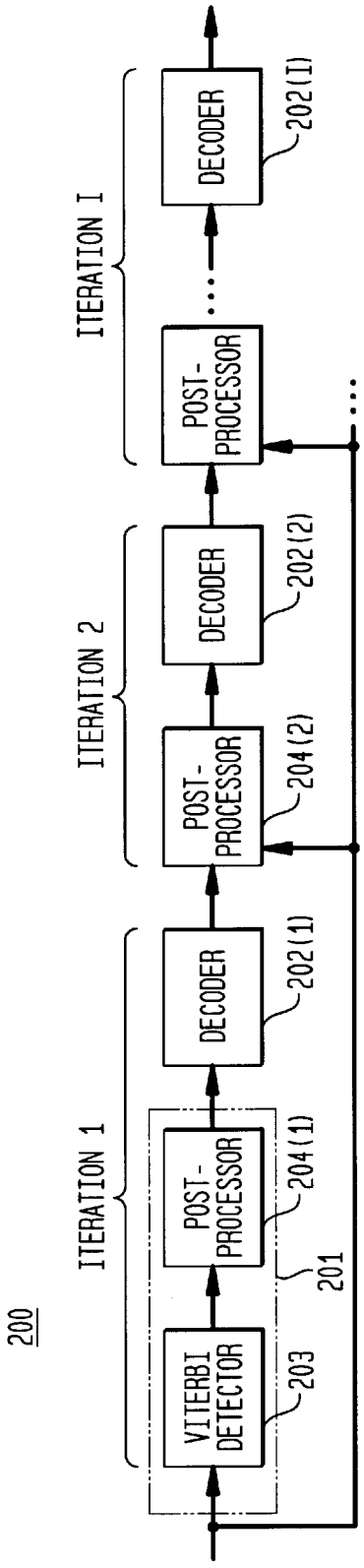
FIG. 2 shows a block diagram of full-iteration decoding with post-processing in accordance with an exemplary implementation of the present invention.

FIG. 2 shows a block diagram of an I-stage iterative decoder 200 implementing detection and post-processing in accordance with an exemplary implementation of the present invention. The first stage of iterative decoder 200 comprises a soft-output Viterbi algorithm (SOVA) detector 201 and decoder 202(1). SOVA detector 201 includes Viterbi detector 203 and post-processor 204(1). The second stage of iterative decoder 200 comprises post-processor 204(2) and decoder 202(2), and each subsequent iteration has a corresponding post-processor and decoder. As shown in FIG. 2, the Ith stage of iterative decoder 200 comprises post-processor 204(I) and decoder 202(I).

For the exemplary embodiment described below, a concatenated code is employed to encode user bits (data) into a vector u of encoded user bits, with $u_j$ being the $j^{th}$ user bit in u. As would be apparent to one skilled in the art, the information may be a matrix in two dimensions or some other format depending on the concatenated code scheme used. The encoded vector u is transmitted through a transmission channel with memory, thus convolving the bits of encoded vector u with the channel impulse response to generate the signal corresponding to the received block of output channel samples. Such transmission channel may be through recording on and playback from a magnetic or optical medium, or may correspond to transmission between users through a cellular/wireless/wired channel.

As shown in FIG. 2, SOVA detector 201 generates soft-output values from the received output channel samples. Soft-output values include reliability values corresponding to the decisions for the received output channel samples, where the "hard" decision for each encoded data value may be derived from the sign of the corresponding reliability value. In accordance with the exemplary embodiment of the present invention, the full SOVA algorithm is applied during the first iteration. For subsequent iterations, only the post-processor of the SOVA detector may be employed since, in each iteration, the corresponding decoder provides a hard decision for decoded user bits at the end of the iteration. Therefore, during a current iteration the post-processor may have the following as input in addition to the updated reliability values from the previous iteration. The original hard decisions for encoded user bits from the first iteration may be input directly or derived from the signs of the corresponding reliability values. Also input may be "new" decisions from the decoder for user bits of the previous iteration (that may, in-turn, be derived based on the concatenated coding scheme to generate updated hard decisions for encoded user bits). The new decisions from the decoder may be employed either directly as reliability information or indirectly as extrinsic reliability information.

As would be apparent to one skilled in the art, other algorithms generating soft-output values employed for detection or decoding in a similar manner to the SOVA algorithm may be employed with the present invention. However, preferred embodiments employ the SOVA algorithm because of the relative simplicity of circuits implementing detection with a Viterbi detector followed by a post-processor when implementing the full SOVA algorithm.

As is known in the art, the Viterbi algorithm determines a surviving path through a trellis of state transitions using path and state metrics. Path and state metrics are related to the relative probability of arriving at one state from a previous state given the current and previously received output channel samples. Reliability values are related to the difference between path metrics. The surviving path of states is a sequence of bits corresponding to decisions for output channel samples that most likely correspond to the encoded bits (i.e., the information bits of u).

Figure 3:
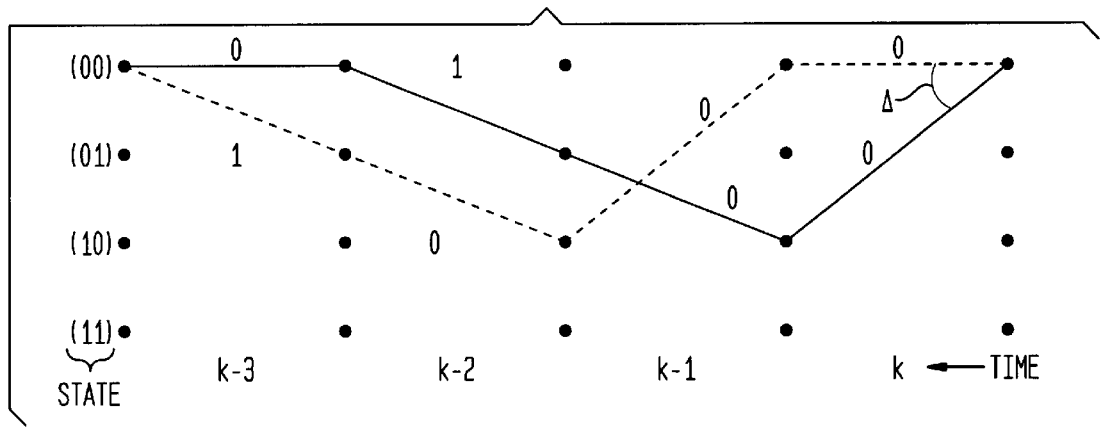
FIG. 3 shows an exemplary portion of the trellis of state transitions employed by a SOVA algorithm.

FIG. 3 shows an exemplary portion of the trellis of state transitions employed by Viterbi algorithm of the SOVA detector of FIG. 2 with channel memory v equal to two. A channel memory v equal to two yields four states (shown as 00, 01, 10, and 11) that may correspond to two bits in the detector. The solid line represents the surviving path and the dashed line shows a concurrent path merging into state 00 at time k. The concurrent path represents a different path through the trellis corresponding to a different sequence of bits. In FIG. 3, a logic "0" or a logic "1" associated with the transition lines between states for each increment of time indicates the value of the user information bit $u_j$ associated with the transition.

As is known in the art, an Add-Compare-Select (ACS) circuit may be used in the detector to implement the VA algorithm determining the surviving path. When two different paths through the trellis merge into one state at a given time, the corresponding path metrics of the different paths are compared and the path having the lower likelihood is discarded. For the comparison, the difference between the path metrics of the two different paths is defined as $\Delta$, and the path metric difference $\Delta(\Delta \geq 0)$ is used to update the reliability values of previous decisions of encoded user bits for output channel samples.

The quantity D is defined as the decision delay in path memory. An error event is defined as the difference between the maximum-likelihood (ML) decision sequence $u^{ML}$ and the erroneous decision sequence $u^e$. An erroneous channel output vector $x^e$ and a maximum-likelihood channel output vector $x^{ML}$ are generated by convolving the channel impulse response with $u^e$ and $u^{ML}$, respectively. Given these definitions, the difference $\Delta$ at time k between the ML channel output vector $x^{ML}$ and the erroneous channel output vector $x^e$ is given in equation (1):

$$\Delta = \sum_{j=k-v-l}^{k} \left( (y_j - x_j^e)^2 - (y_j - x_j^{ML})^2 \right) \quad (1)$$

where $x_j^e$ is the $j^{th}$ element in the erroneous channel output vector $x^e$ and $x_j^{ML}$ is the jth element the ML channel output vector $x^{ML}$. The value $y_j$ is the $j^{th}$ element of the block of output channel samples corresponding to $u_j$. The length l is defined as a distance between the first and last nonzero element in the error event, and the length v is the channel memory.

Given equation (1), the reliability value $L_j$ for a decision $u_j$ at time k is updated as given in equation (2):

$$L_j = \min(L_j, \Delta) j = k-v, \ldots, k-D \quad (2)$$

if the decision for the $j^{th}$ user bit $u_j$ of the surviving path in trellis is different from the corresponding (in time) decision of the concurrent path in the trellis.

Returning to FIG. 3, at time k−3 and at time k−2, the tentative decisions for information bits of the concurrent path differ from the tentative decisions for the information bits of the surviving path. The dashed line represents a concurrent path through the trellis formed from the erroneous input sequence. The solid line represents a surviving path through the trellis formed from the maximum-likelihood channel input sequence. The path metric difference $\Delta$ between the surviving path and the concurrent path is then used to update the reliability values for the corresponding decisions by $L_j = \min(L_j, \Delta)$ for j=k−3, k−2. A detector implementing the full SOVA algorithm updates the reliability value sets of length D for all $2^v$ states as well as updating the values of the hard decisions for the bits of information vector u. A post-processor is employed to reduce unnecessary operations associated with updating the reliability values.

A circuit implementation of the SOVA algorithm may include control logic to update reliability values as well as store soft-output values for all $2^v$ states when detecting using a trellis with path memory length D. This complexity is related to operations for updates and revised computations over the $2^v$ survivor paths, since the maximum-likelihood (ML) decision sequence through the trellis (corresponding to the maximum-likelihood sequence of received encoded data bits) is not yet determined until the end of the detection process. A post-processor that performs update operations after the ML decision sequence is determined, avoids storing and tracking all potential surviving paths through $2^v$ states, thus reducing the design complexity. However, the ordinary trace-back operation (verifying paths in the reverse direction of the trellis) is still performed for all $2^v$ states to compute the path metric difference $\Delta$ of the ML decision sequence.

A post-processor may further reduce the complexity of the implementation if the difference $\Delta$ between paths is only computed for a given set of error events, since the difference $\Delta$ may be calculated without keeping path metrics for the other states. A proper set of most likely error events is determined in advance by, for example, a computer search during the design process. For a given error event, the difference $\Delta$ may be computed from the ML decision sequence and the delayed Viterbi processor input (i.e., the corresponding output channel samples). The difference Δ is then compared to the reliability values that correspond to the non-zero elements in the error event and those reliability values are updated.

Figure 4:
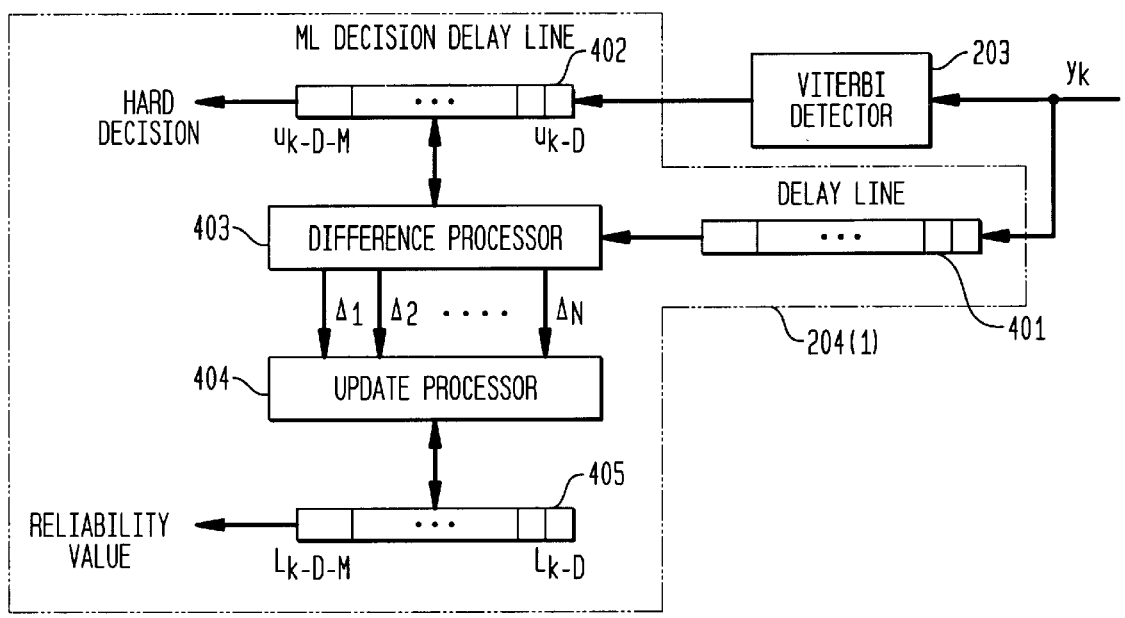
FIG. 4 shows an exemplary implementation of a post-processor shown in FIG. 2.

FIG. 4 shows an exemplary implementation of a post-processor, such as the post-processor 204(1) shown in FIG. 2. In the first iteration, the post-processor 204 receives the elements of two input sequences: one sequence corresponding to the ML decision sequence from Viterbi detector 203 and the other sequence corresponding to the original channel output samples used to generate the ML decision sequence. The sequence of values in the ML decision sequence is passed through ML decision delay line 402. ML decision delay line 402 has a length equivalent to M+1 (M being a non-negative integer), and M is the latency of post-processor 204. The value for latency M is the sum of the length of the longest error event and the channel memory v. The sign of the values of the ML decision sequence may represent the hard decisions for elements of the ML decision sequence for detected, encoded data. The ML decision sequence is delayed from time k by D clock cycles that may be required by Viterbi detector 203 to make a decision for the sequence of values (i.e., a decision for the encoded user bit $u_{k-D}$). The second sequence are the (noisy) output channel samples provided by delay line 401 (i.e., delay line 401 provides $y_{k-D}$ to match encoded user bit $u_{k-D}$ output from Viterbi detector 203).

With these two input sequences, difference processor 403 computes differences for the $i^{th}$ pair of path metrics (i.e., $\Delta_i$'s) based on the given error events $e_i$ for i=1,2, ..., N (where N is an integer). The value for N is predetermined based on the characteristics of the channel and is N is predefined number of error events considered by the post-processor 204(1)). Such computation for a difference $\Delta_i$ for the error event $e_i$ may be as given in equation (1). Simulation of post-processors shows that seven or eight most dominant error events (i.e., N is 7 or 8) are sufficient to generate the SOVA output without noticeable degradation in detection performance.

Then for each difference $\Delta_i$, for j=$j_1$, ..., $j_{ei}$ (corresponding to the locations of nonzero error elements in $e_i$), update processor 404 updates the reliability values $L_j$ for j=k–D–M, ..., k–D in accordance with an update rule of the maximum-likelihood (e.g., VA) algorithm. Each reliability value $L_j$ is updated such as given by equation (2). At M clock cycles after the Viterbi algorithm passes its decision to the post-processor 204(1), the final reliability value is then generated. As would be apparent to one skilled in the art, processors 403 and 404 may be implemented in the same application-specific device, digital signal processor, or other form of dedicated circuitry in, for example, an integrated circuit. The updated reliability values $L_j$ for j=k–D–M, ..., k–D are stored in delay line 405 and shifted out concurrently with the original ML path sequence as soft output data values.

Returning to FIG. 2, decoder 202(1) generates decisions for decoded user bits from the soft-output values from post-processor 204(1). For each subsequent iteration (e.g., iteration 2), only a post-processor is employed to update the reliability values based on the output channel samples prior to decoding. The sign of the reliability value may correspond to the hard decisions for the detected encoded bit. In addition, the decisions for decoded user bits from the previous iteration, and the corresponding reliability values for those decisions, may be used indirectly to update the reliability values of the detected ML decision sequence before detection of encoded user bits in the current iteration.

A fully decoded block is provided as data from the Ith decoding module 202(I), corresponding to the Ith decoding iteration. For a circuit implementation, a single SOVA detector with a VA detector and post-processor and a single decoder may be employed using feedback from the output of the decoder back to the input of the post-processor. The iterative decoder then completes I iterations through an initial VA detection, post-processing, and decoding step followed by (I–1) steps of post-procesing and decoding with soft-output decoded data from the feedback path.

An implementation of an iterative decoder with post-processing in accordance with the present invention may provide for the following advantages. By utilizing the post-processing of SOVA for iterations after the first iteration, a complex circuit implementing SOVA at each iteration of a serial iterative decoder may be avoided. Since full detection is only implemented once, fewer steps are implemented in the decoding process, resulting in a reduction in soft-output data generated, stored, and tracked. Such reduction reduces complexity of circuits in concatenated coded systems when compared to circuits implementing iterative decoding with full iteration of the prior art.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. In a signal processing application, an iterative decoder for decoding user data encoded with a concatenated code, the iterative decoder comprising:
   (a) a soft-output detector; and
   (b) at least one post-processor and decoder pair, wherein:
      in a first iteration:
      (1) the soft-output detector generates, from output channel samples, soft-output values corresponding to decisions for the encoded user data;
      (2) the post-processor of a first pair updates a set of reliability values corresponding to the decisions for the encoded user data based on the decisions and the output channel samples; and
      (3) the decoder of the first pair decodes the set of soft-output values to provide decisions for decoded user data; and
   (b) in a subsequent iteration:
      (1) the post-processor of a pair updates the set of reliability values to form a new set of soft-output values; and (2) the decoder of the pair decodes the new set of soft-output values to provide new decisions for the decoded user data.

2. The invention of claim 1, wherein the pair in the subsequent iteration is the first pair.

3. The invention of claim 1, wherein the pair in the subsequent iteration is different from the first pair.

4. The invention as recited in claim 1, wherein the post-processor includes a difference processor and an update processor, the difference processor calculating a difference for each error event defined by a maximum-likelihood channel output vector and an erroneous channel output vector, and the update processor updating, for each error event, one or more reliability values of the set based on the difference.

5. The invention as recited in claim 4, wherein the soft output detector includes a Viterbi detector, and the soft output detector and the post processor implement a soft-output Viterbi algorithm.

6. The invention as recited in claim 1, wherein each post processor tracks hard decisions for detected encoded bits using the sign of a corresponding reliability value.

7. The invention as recited in claim 1, wherein the iterative decoder is embodied in an integrated circuit.

8. The invention as recited in claim 1, wherein the iterative decoder is implemented in a receiver of either 1) a wired, wireless, or cellular communication system or 2) a receiver of a magnetic or optical recording and playback system.

9. In a signal processing application, a method for decoding user data encoded with a concatenated code, comprising the steps of:
   (a) in a first iteration:
      (1) generating, from output channel samples, soft-output values corresponding to decisions for the encoded user data;
      (2) updating a set of reliability values corresponding to the decisions for the encoded user data based on the decisions and the output channel samples; and
      (3) decoding the set of soft-output values to provide decisions for decoded user data; and
   (b) in a subsequent iteration:
      (1) updating the set of reliability values to form a new set of soft-output values; and
      (2) decoding the new set of soft-output values to provide new decisions for the decoded user data.

10. The invention as recited in claim 9, wherein each step of updating the set of reliability values includes the steps of calculating a path metric difference for each error event defined by a maximum-likelihood input sequence and an erroneous input sequence, and updating, for each error event, one or more reliability values of the set based on the difference.

11. The invention as recited in claim 10, wherein the steps of generating soft output values and updating the set of reliability values is in accordance a soft-output Viterbi algorithm.

12. The invention as recited in claim 10, wherein the method tracks hard decisions for detected encoded bits using the sign of a corresponding reliability value.

13. The invention as recited in claim 9, wherein the method is embodied in a processor of an integrated circuit.

14. The invention as recited in claim 9, wherein the method is implemented in a receiver of either 1) a wired, wireless, or cellular communication system or 2) a receiver of a magnetic or optical recording and playback system.

15. A computer-readable medium having stored thereon a plurality of instructions, the plurality of instructions including instructions which, when executed by a processor, cause the processor to implement a method of iterative decoding of user data encoded with a concatenated code, the method comprising the steps of:
   (a) in a first iteration:
      (1) generating, from output channel samples, soft-output values corresponding to decisions for the encoded user data;
      (2) updating a set of reliability values corresponding to the decisions for the encoded user data based on the decisions and the output channel samples; and
      (3) decoding the set of soft-output values to provide decisions for decoded user data; and
   (b) in a subsequent iteration:
      (1) updating the set of reliability values to form a new set of soft-output values; and
      (2) decoding the new set of soft-output values to provide new decisions for the decoded user data.

\* \* \* \* \*